(12) United States Patent
Franke et al.

(10) Patent No.: US 6,233,816 B1
(45) Date of Patent: *May 22, 2001

(54) VIBRATION SENSITIVE ISOLATION FOR PRINTED CIRCUIT BOARDS

(75) Inventors: Earnest A. Franke, North Largo; Judd O. Sheets, St. Petersburg; Steven R. Crose, Pinellas Park, all of FL (US)

(73) Assignee: Raytheon Company, Lexington, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/915,417

(22) Filed: Aug. 20, 1997

Related U.S. Application Data

(60) Continuation of application No. 08/409,079, filed on Mar. 22, 1995, now abandoned, which is a division of application No. 08/155,696, filed on Nov. 23, 1993, now Pat. No. 5,453,580.

(51) Int. Cl.[7] ....................................................... H05K 3/00
(52) U.S. Cl. .............................................. 29/829; 29/829
(58) Field of Search ........................... 29/846, 847, 829; 267/136; 248/636

(56) References Cited

U.S. PATENT DOCUMENTS

| 3,272,909 | 9/1966 | Bruck et al. . |
|---|---|---|
| 3,777,220 | 12/1973 | Tatusko et al. . |
| 4,413,766 | 11/1983 | Webster . |
| 4,641,222 | 2/1987 | Derfiny et al. . |
| 4,675,989 | 6/1987 | Galloway et al. . |
| 4,768,286 | * 9/1988 | Ketchum .................................. 29/841 |
| 4,903,169 | 2/1990 | Kitagawa et al. . |
| 4,937,934 | 7/1990 | Devera et al. . |
| 5,058,265 | 10/1991 | Goldfarb . |
| 5,112,230 | 5/1992 | DeSimone . |
| 5,161,305 | 11/1992 | Yamakawa . |
| 5,172,461 | 12/1992 | Pichl . |
| 5,285,353 | * 2/1994 | Buck et al. ............................. 361/732 |
| 5,331,513 | 7/1994 | Hirai et al. . |

FOREIGN PATENT DOCUMENTS

| 2126428 | 3/1984 | (GB) . |
|---|---|---|
| 1-266790 | 10/1989 | (JP) . |

* cited by examiner

*Primary Examiner*—Lee Young
(74) *Attorney, Agent, or Firm*—Baker Botts L.L.P.

(57) ABSTRACT

A printed circuit board includes vibration areas where vibration sensitive components of an electrical circuit design fabricated on the printed circuit board are mechanically isolated from supporting circuitry. The present invention provides a printed circuit board with areas having an increased natural resonant frequency of vibration for the circuit board area where the vibration sensitive circuit is located. The printed circuit board comprises a number of slots, holes or other openings around the vibration sensitive circuitry. In addition, one or more circuit board conductive paths are provided for maintaining electrical conductivity between the isolated circuit and the supporting circuits.

5 Claims, 3 Drawing Sheets

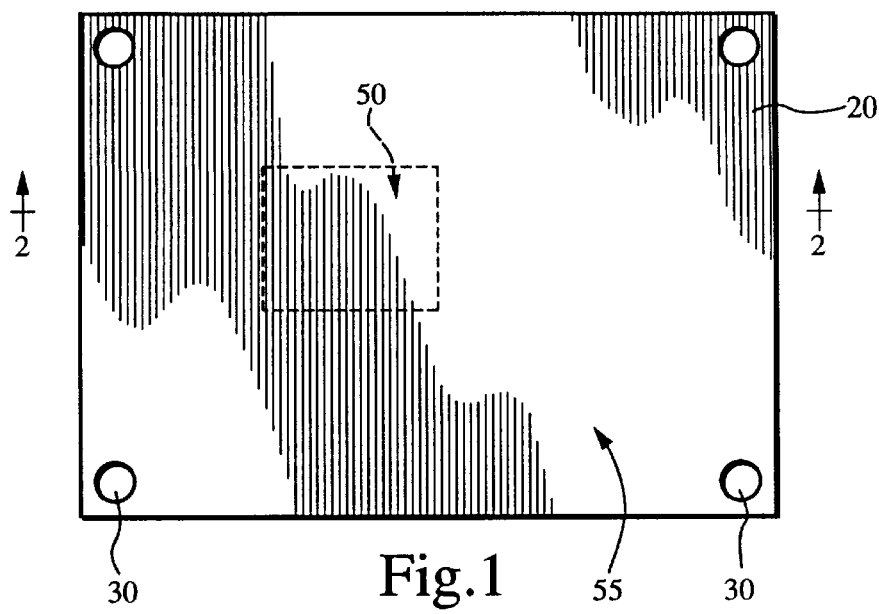
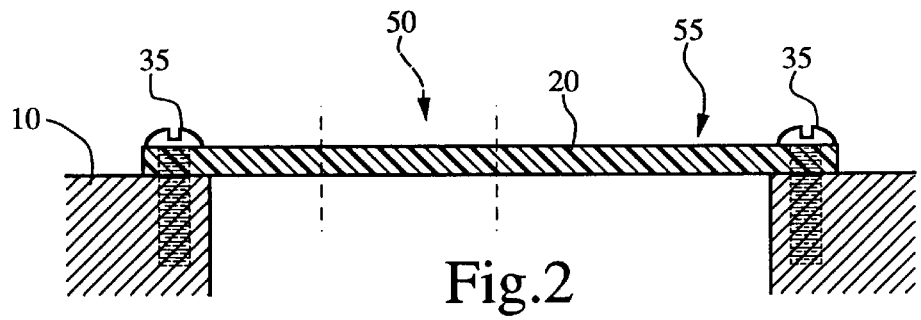
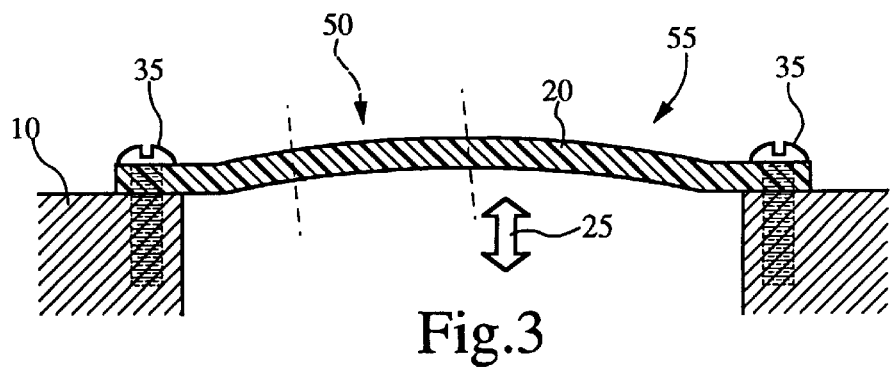

VIBRATION SENSITIVE ISOLATION FOR PRINTED CIRCUIT BOARDS

This is a continuation of application Ser. No. 08/409,079 filed Mar. 22, 1995 now abandoned, which is a division of application Ser. No. 08/155,696, filed on Nov. 23, 1993 now U.S. Pat. No. 5,453,580.

TECHNICAL FIELD

The present invention relates to fabricating electrical circuits on printed circuit boards, and in particular to a method of manufacturing printed circuit boards so as to minimize the effects of external vibration sources on circuit components attached thereto.

BACKGROUND

A typical circuit design implemented on a printed circuit board contains parts such as transistors, resistors, capacitors and integrated circuits. Assembly of circuit designs on printed circuit boards is a favored industry practice because it permits low-cost production and easy maintenance.

It is not unusual for a circuit design implemented on a printed circuit board to contain one or more vibration sensitive components, for example, a voltage controlled oscillator or resonant circuit, in addition to supporting circuitry. Furthermore, it is not unusual for a printed circuit board containing a vibration sensitive circuit or component to be placed in an environment that subjects the board to external vibration forces in an axis perpendicular to the plane of the board, for example, placement of the circuit board in an automobile or airplane. When oriented in this manner, external vibration forces, can cause deflections in the circuit board that influence the operation of vibration sensitive components attached thereto.

As the printed circuit board vibrates and deflects, a small part of the shunt capacitance between the circuit component leads and the ground plane varies in concert with the vibrational motion. Board deflection and the associated shunt capacitance variation are most severe at or near the natural resonance frequency of the printed circuit board. As is well known, this variation in shunt capacitance often causes a corresponding variation in the output oscillation frequency of vibration sensitive components or resonant circuits mounted to the vibrating circuit board.

Local oscillators used in telecommunications equipment are most susceptible to the effects of circuit board vibration and deflection. Deviations in the local frequency of oscillation caused by shunt capacitance variation resulting from circuit board vibration and deflection corrupts the output spectrum of the local oscillator. Corruption of this kind is known as incidental frequency modulation and manifests itself as phase jitter when measuring data signals. In conclusion, variable shunt capacitance effects from vibrating and deflecting circuit boards can render sophisticated and important vibration sensitive circuitry unusable or unreliable in hostile environments.

Accordingly, there is a need for an improved mounting of vibration sensitive circuit components on printed circuit boards to minimize the effects of external vibration sources on vibration sensitive circuit components.

SUMMARY OF THE INVENTION

The present invention provides for mounting circuit components on printed circuit boards to minimize the effects of external vibration sources on circuit components attached thereto by mechanically isolating vibration sensitive circuitry and components from supporting circuitry. As is well known, the natural resonance frequency of a circuit board is a function of the board's length, width and thickness. Mathematical resonance analysis discloses that the smaller the board area exposed to vibration, the higher its natural resonance frequency.

According to the preferred embodiment of the present invention, a plurality of holes, slots or other openings are cut into the printed circuit board surrounding the vibration sensitive circuitry or components to raise the natural resonant frequency of the isolated board area above the expected external vibration frequency spectrum. Furthermore, in one embodiment, a rigid cover may be attached to the isolated board area to further inhibit vibration and deflection of the isolated circuit board area.

Other advantages and applications derived from the use of the mounting of the present invention will readily suggest themselves to those skilled in the art from consideration of the following Detailed Description taken in conjunction with the accompanying Drawings.

BRIEF DESCRIPTION OF THE DRAWINGS

A complete understanding of the invention may be had by reference to the following Detailed Description when taken in conjunction with the accompanying Drawings wherein:

FIG. 1 is a top view of a printed circuit board having a vibration sensitive circuitry area;

FIG. 2 is a side cross-sectional view of the printed circuit board of FIG. 1 taken along lines 2—2;

FIG. 3 is a side cross-sectional view of the printed circuit board of FIG. 1 showing, in an exaggerated manner, circuit board vibration and deflection in response to external vibration forces in an axis perpendicular to the plane of the circuit board;

DETAILED DESCRIPTION OF THE DRAWINGS

Figure 4A:
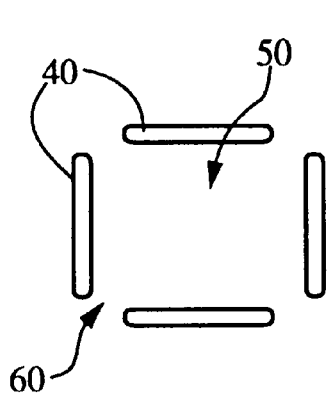
FIG. 4A is a top view showing one slot pattern cut into the printed circuit board of FIG. 1 to isolate an area of the board to which are mounted vibration sensitive components from other board areas.

Referring now to FIGS. 1 and 2, there is shown a printed circuit board 20 upon which a plurality of circuit components (not shown) may be mounted for implementing a desired circuit design. A number of openings 30 are provided to enable circuit board 20 to be mounted to a support housing 10 by means of screws 35 or other mounting apparatus. The circuit components attached to the printed circuit board 20 may comprise one or more vibration sensitive circuitry areas 50. In addition, the printed circuit board 20 may also contain circuit components that comprise a support circuitry area 55. Printed circuit boards as shown in FIG. 1 are often installed in automobiles, aircraft or other vehicles, and subjected to external environmental vibration forces.

Referring now to FIGS. 2 and 3, during external vibration in an axis perpendicular to the plane of the printed circuit board, the vibration acceleration forces 25 exerted on the printed circuit board 20 cause the board to deflect from the stable resting position shown in FIG. 2 to a deflected position shown in an exaggerated manner in FIG. 3. As is well known, when the circuit board vibrates and deflects, a small part of the shunt capacitance for the circuit board varies in concert with the vibrational motion. This variation in capacitance often causes a corresponding variation in the output oscillation frequency of vibration sensitive components or resonant circuits mounted to the circuit board. Board deflection and the associated shunt capacitance variation are most severe when the board is externally vibrated at a frequency at or near the natural resonance frequency of the circuit board.

A substantially rectangular, epoxy fiberglass, printed circuit board of length (l), width (w), and thickness (h), supported on all four edges, can be mathematically analyzed to determine its natural resonance frequency of vibration, $f_o$, from the following equations:

$$f_n = (\pi/2) \sqrt{(D\delta)} \ (1/l^2 + 1/w^2), \quad (1)$$

$$D = (E \cdot h^3)/12(1-\mu^2), \quad (2)$$

$$\delta = mass/area = W/g \cdot l \cdot w, \quad (3)$$

wherein E=the board modulus of elasticity,
wherein D=the board stiffness,
wherein W=the total weight of the printed circuit board and its components,
wherein A=poisson's ratio, and
wherein g=the acceleration due to gravity.

For example, for a G10 epoxy-fiberglass printed circuit board with the following dimensions:

l=6 inches,
w=4 inches, and
h=0.0625 inches,
the coefficients for equations (1)–(3) are as follows:

$E = 2 \times 10^6 lb/in^2$, $\mu = 0.12$, and

W=0.35 lb, and Equations (1)–(3) are therefore solved as follows:

$\delta = (0.35)/(386)(6)(4) = 0.3778 \times 10^{-4} lb \ s^2/in^3$ $D = (2 \times 10^6)(0.0625)^3/[12 \ (1-(0.12)^2)] = 40.30 \ lb \ in.$ $f_n = (\pi/2)\sqrt{(40.3/0.3778 \times 10^{-4})}[\frac{1}{36} + \frac{1}{16}] = 146 \ Hz$ Thus, the printed circuit board has a natural resonant frequency of 146 hertz. It is at this external frequency of vibration that the vibration acceleration forces incident on the printed circuit board will produce large shunt capacitance variations and deflections in the board, potentially causing severe problems for the attached vibration sensitive circuitry.

As shown above, the natural resonant frequency of vibration for a given printed circuit board is a function of several factors including the length, width and thickness of the board. As the length and width of a printed circuit board are decreased, the natural resonant frequency of the circuit board increases. Table 1, below, applying equations (1)–(3) above for calculating natural resonant frequency illustrates this increase in natural resonant frequency as the size of a typical printed circuit board is reduced from six by four inches to one square inch.

TABLE 1

| LENGTH in inches | WIDTH in inches | NATURAL RESONANT FREQUENCY in Hertz |
|---|---|---|
| 6 | 4 | 146 |
| 2 | 2 | 811 |
| 1.5 | 1.5 | 1,442 |
| 1 | 1 | 3,245 |

By cutting a number of slots, holes or openings around the vibration sensitive circuitry, the mounting of the present invention mechanically isolates the circuitry by decreasing the length and width of the circuit board that an external vibration source may affect. As shown in Table 1, the slots act to reduce the exposed board area and increase its natural resonant frequency. The correct slot size will result in an increase of the board's natural resonant frequency above the external vibration frequency spectrum (normally from 5 hertz to 2 kilohertz) thereby mitigating the adverse effects on vibration sensitive circuits or components.

Figure 4B:
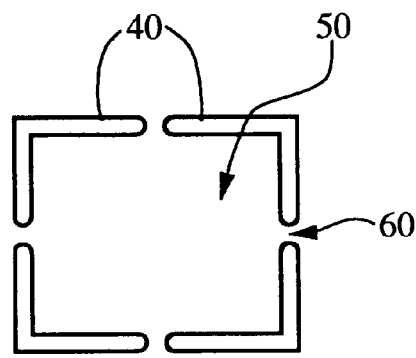
FIG. 4B is a top view showing a second slot pattern cut into the circuit board of FIG. 1 to isolate an area of the board to which are mounted vibration sensitive components from other board areas.
Figure 5:
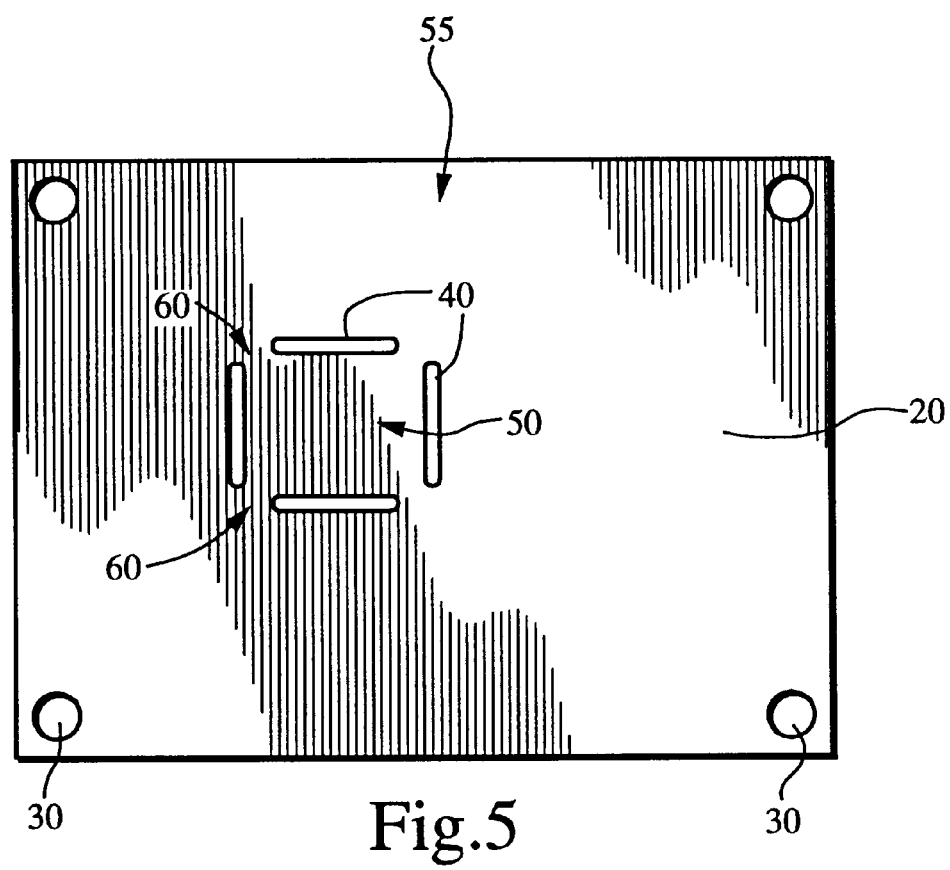
FIG. 5 is a top view of a printed circuit board incorporating the mechanical isolation slots as shown in FIG. 4A.

Referring now to FIGS. 4A, 4B and 5, there is shown two suggested slot patterns for implementing the mounting of present invention. For each pattern, a number of slots 40 are cut into the printed circuit board to mechanically isolate the circuit area 50 from other circuit areas of the printed circuit board. One or more conducting paths 60 remain on the printed circuit board to maintain an electrical path between the circuit area 50 and its supporting circuit area 55. Use of conducting paths 60 minimizes the need for providing hook-up wires to interconnect the vibration sensitive components in circuit area 50 and support area 55. The conducting paths 60 also serve to maintain a physical support connection for the isolated portion of the circuit board. It should be readily apparent that various other types of slot, hole or other opening arrangements for isolating, vibration sensitive circuitry are possible and the embodiments shown in FIGS. 4A and 4B are merely examples of two such arrangements.

Figure 6:
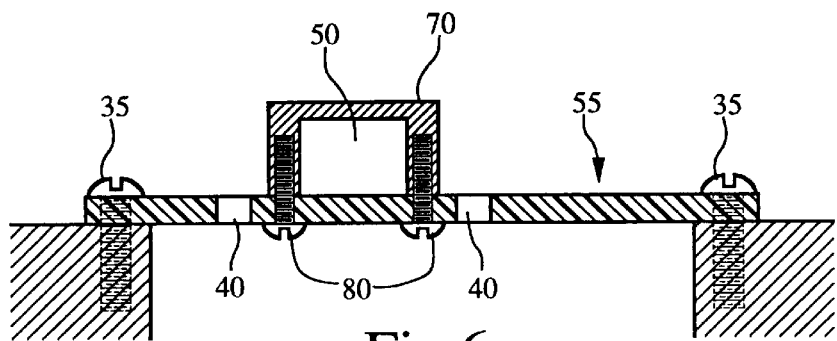
FIG. 6 is a side cross-sectional view of a circuit board incorporating the method of the present invention for mechanically isolating vibration sensitive circuitry.

Referring now to FIG. 6, there is shown a side cross-sectional view of the preferred embodiment of the present invention. The preferred embodiment consists of a number of slots 40 or other openings cut in a printed circuit board 20 around a vibration sensitive circuit area 50 containing vibration sensitive circuit components. A rigid cover 70 may also be attached to the printed circuit board 20 within the vibration sensitive circuitry area 50 by means of screws 80. The rigid cover 70 tends to act as a stiffener for the printed circuit board to reinforce the mechanical isolation effect of the present invention.

Figure 7:
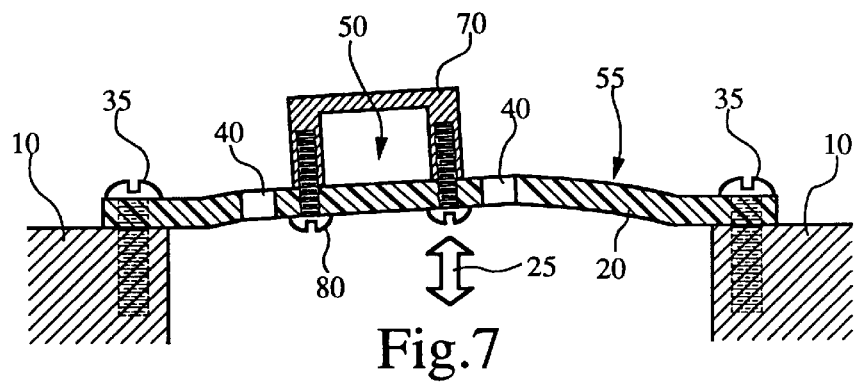
FIG. 7 is a side cross-sectional view of a printed circuit board incorporating the mounting of the present invention illustrating vibration and deflection.

In FIG. 7, the preferred embodiment of the present invention illustrated in FIG. 6 is shown isolating the circuit area 50 of the printed circuit board 20 from the vibration created bending effects experienced by the other areas of the printed circuit board during application of vibration acceleration forces 25 in an axis perpendicular to the plane of the board.

Figure 8:
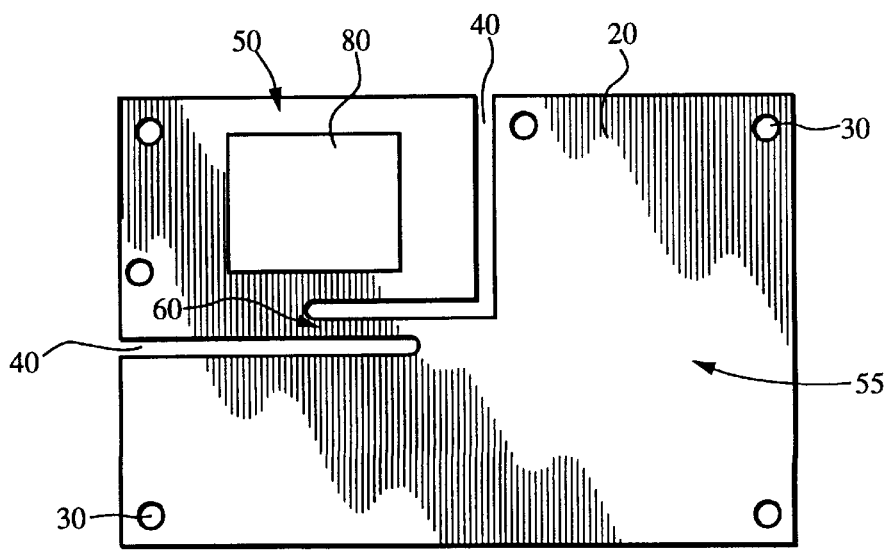
FIG. 8 is a top view of a printed circuit board showing a specific application of the present invention to mechanically isolate a portion of a circuit from its supporting circuitry.

In a typical application of the mounting system of the present invention as shown in FIG. 8, a voltage controlled oscillator 80 located within the circuit area 50 of the printed circuit board 20 has been mechanically isolated from the supporting circuit area 55 by cutting two slots 40 in the printed circuit board. A conductive path 60 remains to interconnect the circuit area 50 from the supporting circuit area 55. This conductive path 60 may be used to supply power, couple the output signal, provide a ground path, and inject a phase locking error signal for the voltage controlled oscillator.

Although preferred embodiments of the invention have been illustrated in the accompanying Drawings and described in the Detailed Description, it will be understood that the invention is not limited to the embodiments disclosed but is capable of numerous rearrangements and modifications of parts and elements without departing from the scope of the invention set forth and defined by the following claims.

What is claimed is:

1. A method of minimizing the effect of vibration caused by external sources by mechanically raising the natural resonance frequency of an isolated area of a circuit board above the anticipated external vibration frequency spectrum to isolate vibration sensitive circuits or components and supporting circuitry mounted on the isolated area of a circuit board, comprising:

determining the length or width of an isolated area of a circuit board having a given thickness, modulus of elasticity and stiffness, the isolated area supporting the vibration sensitive circuits having a resulting natural resonance frequency, $f_n$, exceeding an anticipated frequency of vibration caused by external sources wherein for a given length determining the width or for a given width determining the length as follows:

$$f_n = (\pi/2)/\sqrt{(D/\delta)}(1/\Lambda^2 + 1/w^2), \quad D = (E \cdot h^3)/12(1-\mu^2),$$

$$\delta = \text{mass/area} = W/g \cdot \Lambda \cdot w,$$

where E=the circuit board modulus of elasticity,
where D=the circuit board stiffness,
where W=the total weight of the area of the circuit board and components supported thereon,
where p=poisson's ratio,
where g=the acceleration due to gravity,
where $\mu$=the length of the area,
where g=the width of the area,
where h=the thickness of the area, and cutting one or more slots in the circuit board for the given or determined length and width to partially encircle the isolated area of the circuit board supporting the vibration sensitive circuits.

2. The method as in claim 1 further comprising selectively cutting the slots in the printed circuit board to maintain one or more conductive paths between the vibration sensitive circuits or components and supporting circuits.

3. The method as in claim 1 further including stiffening the isolated area of the circuit board supporting the vibration sensitive components to reinforce the mechanical isolation of the vibration sensitive circuits.

4. The method as in claim 3 wherein stiffening the area further comprises attaching a rigid cover over the circuit board area supporting the vibration sensitive circuits or components.

5. The method as in claim 1 wherein cutting one or more slots in the circuit board includes:

cutting a plurality of openings in the circuit board to partially encircle the area of the circuit board defined by the given or determined length and width and supporting the vibration sensitive circuits.

* * * * *

UNITED STATES PATENT AND TRADEMARK OFFICE
CERTIFICATE OF CORRECTION

PATENT NO. : 6,233,816 B1
DATED : May 22, 2001
INVENTOR(S) : Earnest A. Franke et al.

It is certified that error appears in the above-identified patent and that said Letters Patent is hereby corrected as shown below:

Column 1,
Line 33, after "forces", delete ",".

Column 3,
Line 26, after "vibration,", delete "$f_o$", and insert -- $f_n$ --.
Line 39, after "wherein", delete "A", and insert -- $\mu$ --.

Column 3, Formula,
Line 29, that portion of the formula reading " $\sqrt{(D\delta)}$ ", should read -- $\sqrt{(D/\delta)}$ --.

Column 5, claim 1,
Line 35, delete " $f_n = (\pi/2) / \sqrt{(D/\delta)}(1/\Lambda^2 + 1/w^2)$,",
and insert -- $f_n = (\pi/2)\sqrt{(D/\delta)}(1/\ell^2 + 1/w^2)$,--.

Line 1, that portion of the formula reading " $W/g \bullet \Lambda \bullet w$," should read -- $W/g \bullet \ell \bullet w$,--.
Line 7, after "where", delete "p", and insert -- $\mu$ --.
Line 9, after "where", delete "$\mu$", and insert -- $\ell$ --.

UNITED STATES PATENT AND TRADEMARK OFFICE
CERTIFICATE OF CORRECTION

PATENT NO. : 6,233,816 B1
DATED : May 22, 2001
INVENTOR(S) : Earnest A. Franke et al.

It is certified that error appears in the above-identified patent and that said Letters Patent is hereby corrected as shown below:

<u>Column 6, claim 1,</u>
Line 10, after "where", delete "$g$", and insert -- $w$ --.

Signed and Sealed this

Fifth Day of February, 2002

Attest:

JAMES E. ROGAN
*Director of the United States Patent and Trademark Office*

*Attesting Officer*